United States Patent
Watanabe et al.

(10) Patent No.: US 9,805,944 B2
(45) Date of Patent: Oct. 31, 2017

(54) METHOD OF MANUFACTURING SILICON CARBIDE SEMICONDUCTOR DEVICE

(71) Applicants: OSAKA UNIVERSITY, Suita-shi, Osaka (JP); FUJI ELECTRIC CO., LTD., Kawasaki-shi, Kanagawa (JP)

(72) Inventors: Heiji Watanabe, Osaka (JP); Takayoshi Shimura, Osaka (JP); Takuji Hosoi, Osaka (JP); Mitsuru Sometani, Tsukuba (JP)

(73) Assignees: OSAKA UNIVERSITY, Suita-Shi, Osaka (JP); FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/444,905

(22) Filed: Feb. 28, 2017

(65) Prior Publication Data

US 2017/0271168 A1   Sep. 21, 2017

(30) Foreign Application Priority Data

Mar. 17, 2016 (JP) .................................. 2016-053685

(51) Int. Cl.
*H01L 29/78* (2006.01)
*H01L 21/3105* (2006.01)
(Continued)

(52) U.S. Cl.
CPC .... *H01L 21/3105* (2013.01); *H01L 21/02378* (2013.01); *H01L 21/266* (2013.01); *H01L 21/283* (2013.01); *H01L 29/1608* (2013.01)

(58) Field of Classification Search
CPC ....... H01L 21/28088; H01L 21/823842; H01L 29/045; H01L 29/0615; H01L 29/0661;
(Continued)

(56) References Cited

U.S. PATENT DOCUMENTS

2010/0044721 A1   2/2010 Fujikawa et al.
2015/0061042 A1*  3/2015 Cheng ................. H01L 29/4966
                                                    257/412
2016/0315186 A1* 10/2016 Kinoshita ........... H01L 29/7811

FOREIGN PATENT DOCUMENTS

JP    2009-146997 A    7/2009
JP    2009-272328 A    11/2009
(Continued)

*Primary Examiner* — Edward Chin
(74) *Attorney, Agent, or Firm* — Rabin & Berdo, P.C.

(57) ABSTRACT

A p-type base region, $n^+$-type source region, $p^+$-type contact region, and n-type JFET region are formed on a front surface side of a silicon carbide base by ion implantation. The front surface of the silicon carbide base is thermally oxidized, forming a thermal oxide film. Activation annealing at a high temperature of 1500 degrees C. or higher is performed with the front surface of the silicon carbide base being covered by the thermal oxide film. The activation annealing is performed in a gas atmosphere that includes oxygen at a partial pressure from 0.01 atm to 1 atm and therefore, the thermal oxide film thickness may be maintained or increased without a decrease thereof. The thermal oxide film is used as a gate insulating film and thereafter, a poly-silicon layer that is to become a gate electrode is deposited on the thermal oxide film, forming a MOS gate structure.

5 Claims, 4 Drawing Sheets

(51) Int. Cl.
*H01L 21/02* (2006.01)
*H01L 21/266* (2006.01)
*H01L 21/283* (2006.01)
*H01L 29/16* (2006.01)

(58) Field of Classification Search
CPC ............. H01L 29/0878; H01L 29/1095; H01L 29/1608; H01L 29/408; H01L 29/41741; H01L 29/41775; H01L 29/4966; H01L 29/66068
See application file for complete search history.

(56) References Cited

FOREIGN PATENT DOCUMENTS

| | | |
|---|---|---|
| JP | 2012-038771 A | 2/2012 |
| JP | 2012-227473 A | 11/2012 |
| JP | 2015-135892 A | 7/2015 |

\* cited by examiner

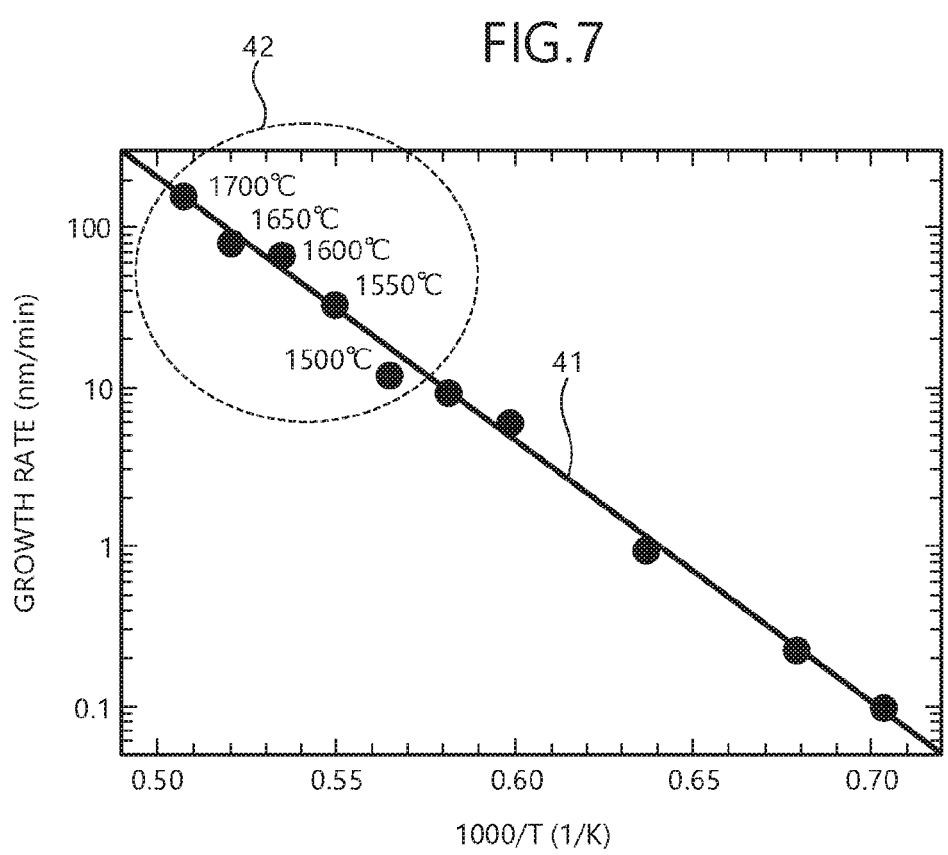

METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2016-053685, filed on Mar. 17, 2016, the entire contents of which are incorporated herein by reference.

BACKGROUND OF THE INVENTION

1. Field of the Invention

Embodiments of the invention relate to a method of manufacturing a silicon carbide semiconductor device.

2. Description of the Related Art

Research has been underway concerning semiconductor devices that use silicon carbide (SiC) as a semiconductor material (hereinafter, silicon carbide semiconductor devices) to realize high-voltage, low-loss semiconductor devices such as transistors, diodes, and the like. In the manufacturing process of a silicon carbide semiconductor device, an impurity that forms carriers (electrons, holes, etc.) is implanted in a semiconductor substrate formed from silicon carbide (hereinafter, silicon carbide substrate) and thereafter, the impurity is activated by heat treatment at a temperature of 1500 degrees C. or higher (hereinafter, activation annealing) to efficiently generate carriers.

However, when such high-temperature heat treatment is performed in a state in which the surface of the silicon carbide substrate is exposed, a problem arises in that surface roughness occurs consequent to sublimation (vaporization) at the surface of the silicon carbide substrate and characteristics of the silicon carbide semiconductor device significantly degrade. Therefore, to reduce the surface roughness of the silicon carbide substrate, typically, the activation annealing is performed in a state in which the surface of the silicon carbide substrate is covered by a cap layer formed from carbon (C) (protective film, hereinafter, carbon cap) (for example, refer to Japanese Patent Laid-Open Publication No. 2012-227473).

As another method of reducing surface roughness of the silicon carbide substrate, a method has been proposed in which a main surface of the silicon carbide substrate is a surface that includes a (0-33-8) face on which surface roughness does not substantially occur with high-temperature heat treatment and thus, the high-temperature heat treatment is performed without the formation of a cap layer (for example, refer to Japanese Patent Laid-Open Publication No. 2012-038771). Another method has been proposed in which activation annealing is performed in a state in which the surface of the silicon carbide substrate is covered by an oxide film ($SiO_2$ film) or a silicon carbide layer acting as a cap layer (for example, refer to Japanese Patent Laid-Open Publication Nos. 2009-146997, 2009-272328, and 2015-135892).

SUMMARY OF THE INVENTION

According to one aspect of the present invention, a method of manufacturing a silicon carbide semiconductor device includes introducing an impurity into a semiconductor substrate containing silicon carbide to form an impurity region in a surface layer on a front surface of the semiconductor substrate; covering the front surface of the semiconductor substrate by an oxide film having a thickness of 1 nm or more, after introducing the impurity and forming the impurity region; and heat treating at a temperature of 1500 degrees C. or higher in a gas atmosphere that includes oxygen so as to activate the impurity, the heat treating being performed with the front surface of the semiconductor substrate being covered by the oxide film.

In the method, the covering the front surface of the semiconductor substrate by the oxide film includes thermally oxidizing the front surface of the semiconductor substrate and forming a thermal oxide film as the oxide film.

In the method, the gas atmosphere has a partial pressure of oxygen gas from 0.01 atm to 1 atm.

The method includes forming an insulated gate structure on the front surface of the semiconductor substrate after activation of the impurity, and the oxide film is left to remain as a gate insulating film of the insulated gate structure.

In the method, the thickness of the oxide film at the covering the front surface of the semiconductor substrate is 30 nm or less.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 6 and 7 are characteristics diagrams of the relationship of thermal oxide film thickness and heat treatment temperature.

DETAILED DESCRIPTION OF THE INVENTION

Figure 1:
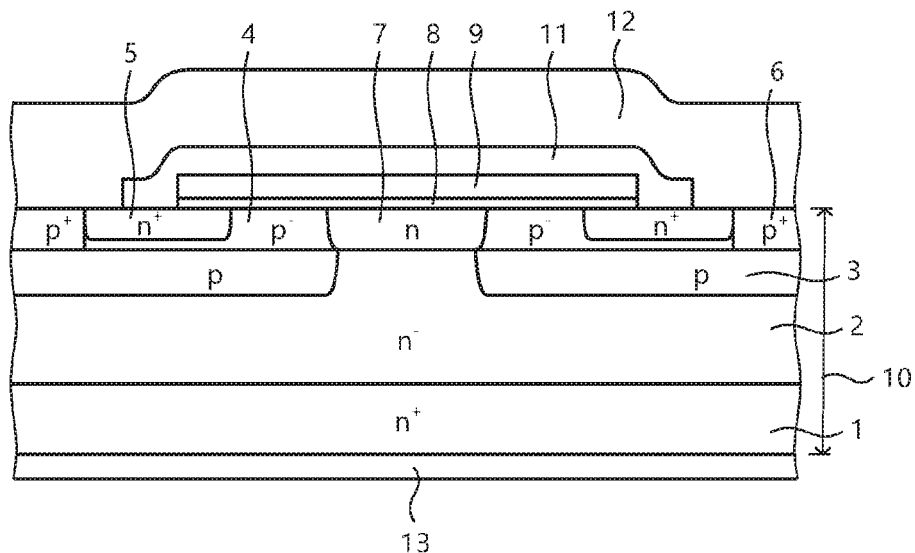
FIG. 1 is a cross-sectional view of an example of a silicon carbide semiconductor device manufactured by a method of manufacturing a silicon carbide semiconductor device according to an embodiment.

Embodiments of a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A structure of a metal oxide semiconductor field effect transistor (MOSFET) will be described as one example of a silicon carbide semiconductor device produced (manufactured) by a method of manufacturing a silicon carbide (SiC) semiconductor device according to an embodiment. FIG. 1 is a cross-sectional view of an example of a silicon carbide semiconductor device manufactured by the method of manufacturing a silicon carbide semiconductor device according to the embodiment. The silicon carbide semiconductor device depicted in FIG. 1 includes a general metal oxide semiconductor (MOS) gate structure on a front surface side of a semiconductor base (hereinafter, silicon carbide base (semiconductor substrate)) 10 formed from silicon carbide.

The silicon carbide base (semiconductor chip) 10 has silicon carbide layers sequentially formed by epitaxial growth on an $n^+$-type supporting substrate (hereinafter $n^+$-type silicon carbide substrate) 1 containing silicon carbide, the silicon carbide layers becoming an $n^-$-type drift region 2 and a $p^-$-type base region 4. The MOS gate structure is provided on the front surface (surface on a $p^-$-type base region 4 side) of the silicon carbide base 10 and includes a p-type base region 3, a $p^-$-type base region 4, an $n^+$-type source region 5, a $p^+$-type contact region 6, an n-type junction FET (JFET) region 7, a gate insulating film 8, and a gate electrode 9. The p-type base region 3 is selectively provided in an $n^-$-type silicon carbide layer that becomes the $n^-$-type drift region 2, and is provided so as to contact the $p^-$-type base region 4. The $n^+$-type source region 5, the $p^+$-type contact region 6, and the n-type JFET region 7 are each selectively provided in a $p^-$-type silicon carbide layer that becomes the $p^-$-type base region 4.

A portion of the $p^-$-type silicon carbide layer exclusive of the $n^+$-type source region 5, the $p^+$-type contact region 6, and the n-type JFET region 7 is the $p^-$-type base region 4. The n-type JFET region 7 is formed by inverting a section of the $p^-$-type silicon carbide layer that becomes the $p^-$-type base region 4 into an n-type. The n-type JFET region 7 is arranged away from the $n^+$-type source region 5, penetrates, in a depth direction, a portion of the $p^-$-type silicon carbide layer that becomes the $p^-$-type base region 4, and reaches the $n^-$-type drift region 2. Further, the n-type JFET region 7 faces the $p^+$-type contact region 6 with the $n^+$-type source region 5 therebetween. The p-type base region 3, the $n^+$-type source region 5, the $p^+$-type contact region 6, and the n-type JFET region 7, as described hereinafter, for example, are diffusion regions formed by activating (activation annealing) an ion-implanted impurity that forms carriers (electrons, holes) by heat treatment (annealing).

The gate insulating film 8 is provided on a surface of the $p^-$-type base region 4 between the $n^+$-type source region 5 and the n-type JFET region 7. The gate insulating film 8, for example, is a silicon dioxide ($SiO_2$) film having a high density and very favorable insulating quality, and is formed by thermal oxidation capable of easily forming a silicon dioxide film. A portion of a cap layer (protective film) protecting the front surface of the silicon carbide base 10 at the time of activation annealing constitutes the gate insulating film 8, for example. The gate electrode 9 is formed on the gate insulating film 8. A source electrode 12 contacts the $n^+$-type source region 5 and the $p^+$-type contact region 6, and is electrically insulated from the gate electrode 9 by an interlayer insulating film 11. A drain electrode 13 is provided on a rear surface of the silicon carbide base 10 (rear surface of the $n^+$-type silicon carbide substrate 1 that becomes an $n^+$-type drain region).

The method of manufacturing a silicon carbide semiconductor device according to the embodiment will be described. FIGS. 2, 3, 4, and 5 are cross-sectional views of states of the silicon carbide semiconductor device during manufacture according to the embodiment. First, the $n^+$-type silicon carbide substrate 1 that becomes the $n^+$-type drain region is prepared. The $n^+$-type silicon carbide substrate 1, for example, may be a silicon carbide single-crystal substrate formed from a 4-layer periodic hexagonal silicon carbide (4H—SiC). The front surface of the $n^+$-type silicon carbide substrate 1, for example, may be preferably a (0001) face (so-called Si face), a (000-1) face (so-called C face), or a crystal face having a surface orientation that has an oxidation rate faster than that of a Si face and slower than that of a C face. Next, on the front surface of the $n^+$-type silicon carbide substrate 1, an $n^-$-type silicon carbide layer 21 that becomes the $n^-$-type drift region 2 is formed by epitaxial growth. Photolithography and p-type impurity ion implantation are performed whereby the p-type base region 3 is selectively formed in a surface portion of the $n^-$-type silicon carbide layer 21. A portion of the $n^-$-type silicon carbide layer 21 exclusive of the p-type base regions 3 becomes the $n^-$-type drift region 2. A resist mask (not depicted) used in the formation of the p-type base regions 3 is removed.

Figure 2:
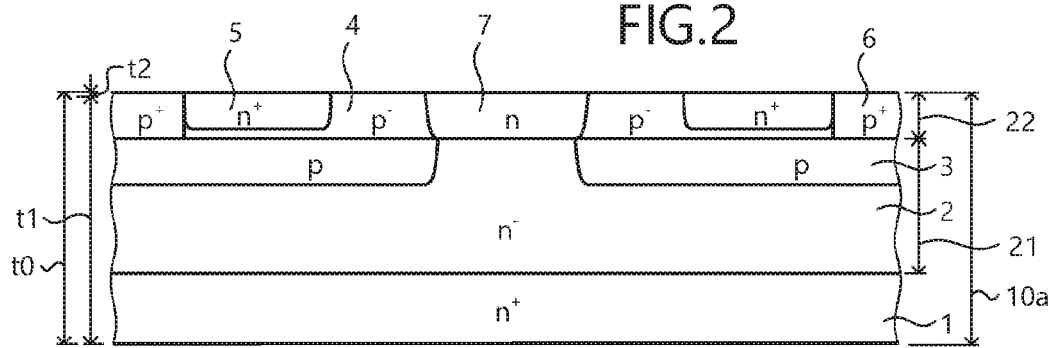
FIGS. 2, 3, 4, and 5 are cross-sectional views of states of the silicon carbide semiconductor device during manufacture according to the embodiment.

Next, on the surface of the $n^-$-type drift region 2 and the p-type base regions 3, a $p^-$-type silicon carbide layer 22 that becomes the $p^-$-type base region 4 is formed by epitaxial growth. By the processes up to here, a silicon carbide base (semiconductor wafer) 10a including the $n^-$-type silicon carbide layer 21 and the $p^-$-type silicon carbide layer 22 sequentially formed on the $n^+$-type silicon carbide substrate 1 by epitaxial growth is formed. At this time, the silicon carbide base 10a has a thickness t0 that is thicker than a product thickness t1 and that takes into consideration, a thickness t2 of a portion that becomes a thermal oxide film 23 (refer to FIG. 3) by a thermal oxidation process and an activation annealing process performed subsequently. A process in which photolithography, impurity ion implantation, and resist mask removal are performed as one set is performed repeatedly under different conditions, selectively forming the $n^+$-type source regions 5, the $p^+$-type contact regions 6, and the n-type JFET region 7 respectively in the $p^-$-type silicon carbide layer 22. The formation sequence of the $n^+$-type source regions 5, the $p^+$-type contact regions 6, and the n-type JFET region 7 may be variously modified. The state up to here is depicted in FIG. 2.

Figure 3:
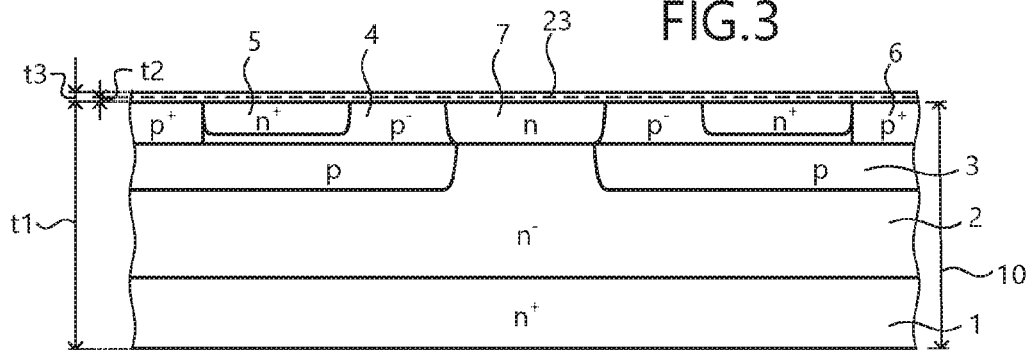
Figure 4:
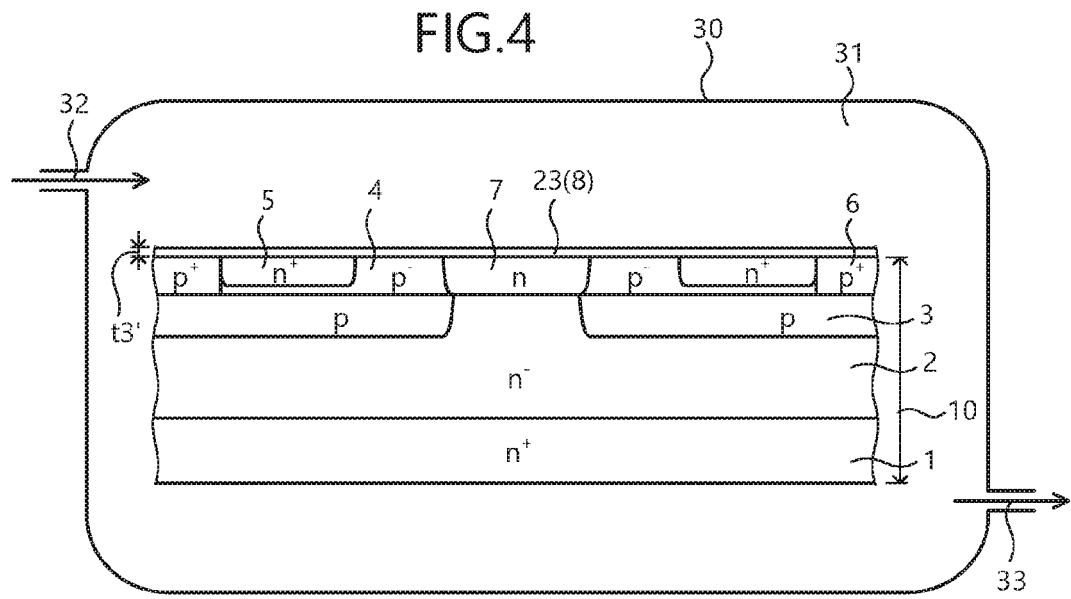

Next, the front surface of the silicon carbide base 10a is thermally oxidized whereby the thermal oxide film 23 is formed (thermal oxidation process). By this thermal oxidation, the thermally oxidized surface layer of the front surface of the silicon carbide base 10a has the thickness t2. As a result, the thickness t0 of the silicon carbide base 10a decreases by the thickness t2 of the portion that becomes the thermal oxide film 23 and the silicon carbide base 10 has the product thickness t1. The front surface of the silicon carbide base 10 is covered by the thermal oxide film 23. The state up to here is depicted in FIG. 3. Reference character t3 is the thickness of the thermal oxide film 23 up to this state. When the thermal oxide film 23 is formed to have the thickness t3 of 1 nm or more, the discharge of silicon atoms from the front surface of the silicon carbide base 10a by high-temperature processing is suppressed whereby an effect as a cap layer may be expected. In FIG. 3, the thickness t2 of the thermal oxidation of the surface layer of the front surface of the silicon carbide base 10a is indicated by a dashed line. Next, in a state with the front surface covered by the thermal oxide film 23, the silicon carbide base 10, for example, is placed in a thermostatic furnace 30 maintained at a constant temperature such as an electric furnace and the impurity in the silicon carbide base 10 is activated (activation annealing process). In the activation annealing, the thermal oxide film 23 functions as a cap layer (protective film) suppressing the occurrence of surface roughness on the front surface of the silicon carbide base 10. The state up to here is depicted in FIG. 4. In the activation annealing process, if the silicon carbide base 10 is placed in the thermostatic furnace 30 containing a gas atmosphere 31 including oxygen and the thermal oxide film 23 is formed to have the thickness t3 of 1 nm or more on the front surface of the silicon carbide base 10a while the temperature of the silicon carbide base 10a is raised from room temperature to 1500 degrees C. required for the activation annealing process, the thermal oxidation process may be omitted.

This activation annealing is performed at a high temperature of 1500 degrees C. or higher, which can activate the impurity in the silicon carbide base 10. The activation annealing is performed using the gas atmosphere 31 that includes oxygen ($O_2$). When the gas atmosphere 31 that includes oxygen is used, a thickness t3' of the thermal oxide film 23 does not decrease even with activation annealing at a high temperature of 1500 or higher. In other words, by making the gas atmosphere 31 of the thermostatic furnace 30 an oxidizing atmosphere, the thermal oxide film 23 does not vaporization (evaporate). Therefore, the front surface of the silicon carbide base 10 may be prevented from being exposed to the gas atmosphere 31. Further, it is not necessary to form the thermal oxide film 23 to be thicker in anticipation of a portion that is vaporized (the amount that thickness decreases: 30 nm or more) by the activation annealing as with conventional techniques. Therefore, in the present invention, the thickness t3 of the thermal oxide film 23 before the activation annealing may be 30 nm or less. Further, when the gas atmosphere 31 that includes oxygen is used, in the activation annealing, the thickness t3' (>t3) of the thermal oxide film 23 may be increased. Thus, the thickness t3' of the thermal oxide film 23 may be suitably adjusted and used as the gate insulating film 8. As a result, since the activation annealing and a process of forming the gate insulating film 8 may be performed simultaneously, the processing may be simplified.

The thickness t3' of the thermal oxide film 23 may be adjusted by the partial pressure of the oxygen gas in the gas atmosphere 31 of the thermostatic furnace 30. In particular, the lower the partial pressure of the oxygen gas is in the gas atmosphere 31 of the thermostatic furnace 30, the less the thickness t1 of the silicon carbide base 10 decreases, and the less the thickness t3' of the thermal oxide film 23 increases. More specifically, by setting the partial pressure of the oxygen gas in the gas atmosphere 31 of the thermostatic furnace 30 to be, for example, about 0.01 atm or more and 1 atm or less, the thickness t3' of the thermal oxide film 23 may be increased. The partial pressure of the oxygen gas being 1 atm means that oxygen gas concentration of the gas atmosphere 31 in the thermostatic furnace 30 is substantially 100% (i.e., gas 32 introduced into the thermostatic furnace 30 is only oxygen gas). The partial pressure of the oxygen gas being 0.01 atm or more means that the oxygen gas concentration of the gas atmosphere 31 in the thermostatic furnace 30 is 1% or more. When the partial pressure of the oxygen gas is less than 1 atm, for example, a noble gas such as argon (Ar) or helium (He), nitrogen (N), hydrogen (H), or water vapor ($H_2O$), an oxynitride gas, or the like may be used as a gas other than the oxygen gas included in the gas 32 introduced into the thermostatic furnace 30. The partial pressure of the oxygen gas in the gas atmosphere 31 of the thermostatic furnace 30 is suitably adjusted according to the temperature in the thermostatic furnace 30 whereby the thickness t3' of the thermal oxide film 23 may be maintained without being increased (t3'=t3). Reference numeral 33 is gas exhausted from the thermostatic furnace 30 by a vacuum pump or the like.

Figure 5:
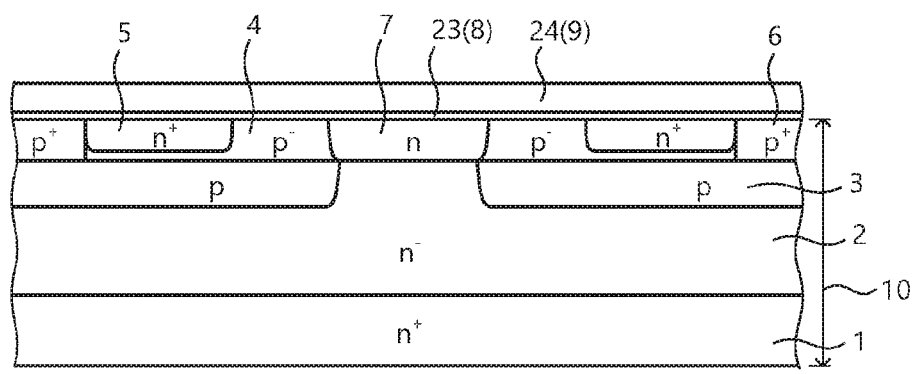

Next, on the thermal oxide film 23, a poly-silicon (poly-Si) layer 24 that becomes the gate electrode 9 is deposited. The state up to here is depicted in FIG. 5. Next, the poly-silicon layer 24 is patterned by photolithography and etching whereby a portion to become the gate electrode 9 is left. Next, the same resist mask (not depicted) for the poly-silicon layer 24 is used and etching is performed whereby the thermal oxide film 23 is patterned and a portion to become the gate insulating film 8 is left. The resist mask used for the patterning of the thermal oxide film 23 is removed. Next, the interlayer insulating film 11 is formed on the front surface of the silicon carbide base 10 so as to cover the poly-silicon layer 24.

The interlayer insulating film 11 is patterned and contact holes are formed by photolithography and etching whereby the $n^+$-type source regions 5 and the $p^+$-type contact regions 6 are exposed. The resist mask (not depicted) used for patterning the interlayer insulating film 11 is removed and the interlayer insulating film 11 is planarized by heat treatment (reflow). Next, on the front surface of the silicon carbide base 10, the source electrode 12 is formed filling the contact holes. The drain electrode 13 is formed on the rear surface of the silicon carbide base 10. Thereafter, the semiconductor wafer is diced (cut) into individual chips whereby the silicon carbide semiconductor device depicted in FIG. 1 is completed.

In the method of manufacturing a silicon carbide semiconductor device according to the embodiment described above, after patterning of the poly-silicon layer 24, the interlayer insulating film 11 may be formed without patterning the thermal oxide film 23 and, the interlayer insulating film 11 together with the thermal oxide film 23 may be patterned. Further, in the method of manufacturing a silicon carbide semiconductor device according to the embodiment described above, although a case in which the thermal oxide film 23, which is the cap layer, is used as a portion of the element structure has been described as an example, the present invention may be applied to a silicon carbide semiconductor device having a configuration that does not use the thermal oxide film 23 as a portion of the element structure. In a case where the thermal oxide film 23 is not used as a portion of the element structure, for example, the thermal oxide film 23 may be completely removed by submersion in hydrofluoric acid (HF).

As described above, according to the embodiment, a thermal oxide film is formed as a cap layer covering the front surface of the silicon carbide base and activation annealing in a gas atmosphere that includes oxygen is performed whereby even with activation annealing at a high temperature of 1500 degrees C. or higher, the thermal oxide film (cap layer) does not vaporize. Therefore, at the time of activation annealing, the front surface of the silicon carbide base may be assuredly protected by the thermal oxide film, enabling the occurrence of surface roughness on the front surface of the silicon carbide base to be suppressed. Further, since the occurrence of surface roughness on the front surface of the silicon carbide base may be suppressed irrespective of the crystal face of the front surface of the silicon carbide base, the degree of freedom in terms of design is higher. According to the embodiment, since the cap layer may be formed by thermal oxidation alone, for example, a sputtering apparatus conventionally used for forming a carbon cap is not required and formation of the cap layer is facilitated.

According to the embodiment, since the cap layer is formed by thermal oxidation without deposition, even when there are uneven portions on the front surface of the silicon carbide base consequent to a trench or the like, step coverage of the cap layer is high. Further, since the cap layer is a thermal oxide film having a high density and very favorable insulating quality, the cap layer may be subsequently used as a portion of an element structure (for example, a gate insulating film, etc.), enabling simplification of the processing. In a conventional case where a carbon cap is used, the carbon cap has to be removed by ashing. However, according to the embodiment, since the cap layer is a thermal oxide film, for example, the cap layer may be easily removed merely by submersion in hydrofluoric acid (HF). Further, removal of the cap layer enables a state that is nearly a state in which the front surface of the silicon carbide base is a sacrificial oxide.

Figure 6:
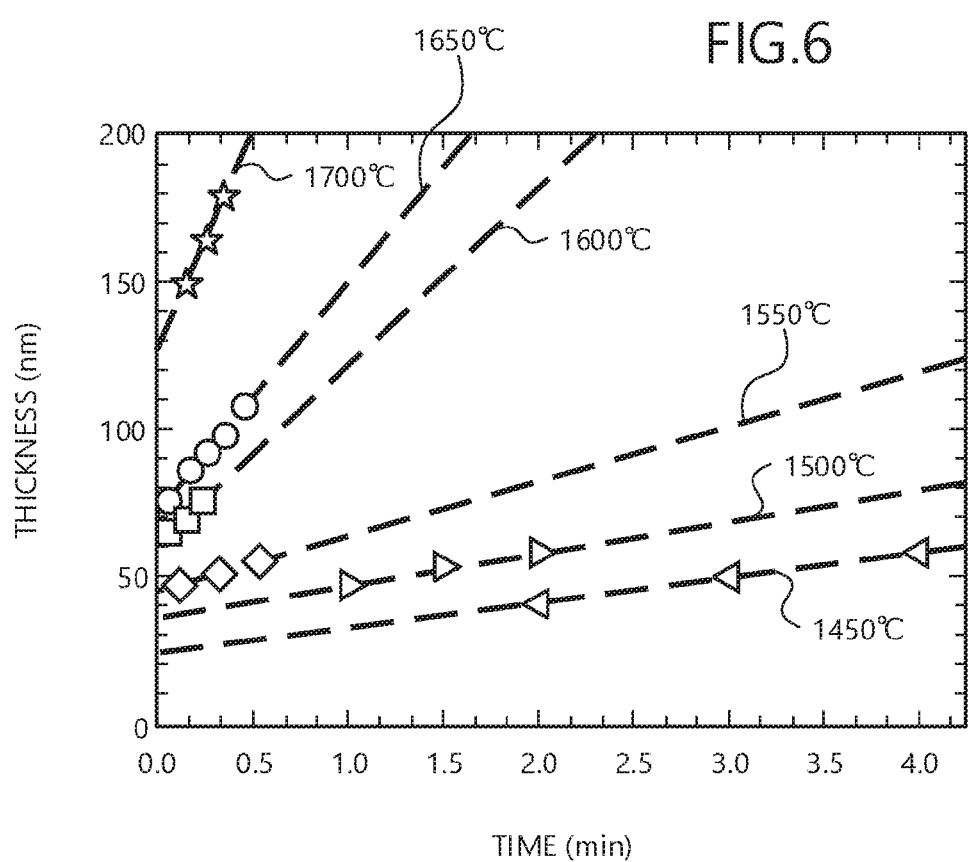

Verification of the thickness t3' of the thermal oxide film 23 when heat treatment is performed in the gas atmosphere 31 that includes oxygen was performed. FIGS. 6 and 7 are characteristics diagrams of the relationship of thermal oxide film thickness and heat treatment temperature. Approximation lines of increases in thermal oxide film thickness with respect to heat treatment temperature are depicted in FIG. 6, for each sample (silicon carbide piece) heat treated (thermally oxidized) in an oxygen gas atmosphere (i.e., partial pressure of oxygen gas was 1 atm) according to the method of manufacturing a silicon carbide semiconductor device according to the embodiment above. In FIG. 6, the horizontal axis is the heat treatment time and the vertical axis is thermal oxide film thickness. The heat treatment temperature for forming the thermal oxide film differed for each sample. In particular, the heat treatment temperatures of the samples were set to be 3 temperatures (1350 degrees C. (not depicted), 1400 degrees C. (not depicted), and 1450 degrees C.) below 1500 degrees C. already confirmed to not decrease thermal oxide film thickness in conventional techniques, and a few temperatures at or above 1500 degrees C. (1500 degrees C., 1600 degrees C., 1700 degrees C.) at which a decrease of thermal oxide film thickness occurs.

Normally, activation annealing of an impurity ion implanted in a silicon carbide base has to be performed at a high temperature of about 1500 to 2000 degrees C. to efficiently generate carriers. With such high-temperature activation annealing, a problem arises in that during the activation annealing, silicon atoms escape from the surface of the silicon carbide base, causing surface roughness. Therefore, conventionally, the activation annealing is performed in a state in which the surface of the silicon carbide base is covered by a cap layer (carbon cap) formed from carbon (C). Additionally, the activation annealing is typically performed in a non-oxidizing atmosphere so that the carbon cap does not vaporize ($CO_2$) during the activation annealing. Further, conventionally, when a thermal oxide film is used as a cap layer, since the thermal oxide film vaporizes with high-temperature activation annealing in a non-oxidizing atmosphere, the thermal oxide film thickness is set taking into consideration in advance the amount by which the thickness will decrease consequent to vaporization and/or an upper limit for the activation annealing temperature is set.

On the other hand, in the present invention, the results depicted in FIG. 6 confirm that even with a temperature of 1500 degrees C. or higher required for activation annealing, thermal oxide film thickness may be increased as the heat treatment time increases. Further, it was confirmed that amount by which thermal oxide film thickness increases may be increased by increasing the temperature. The sections of the approximation lines depicted in FIG. 6 represent thermal oxide film thickness by enhanced initial oxidation. Further, an Arrhenius plot of the growth rate of the thermal oxide film (Arrhenius Plot: calculated values of growth rate of thermal oxide film based on Arrhenius equation) is depicted in FIG. 7. In FIG. 7, the horizontal axis is the reciprocal of the heat treatment temperature (absolute temperature) T [K: kelvin] and the vertical axis is the growth rate of the thermal oxide film. Approximation line 41 depicted in FIG. 7 is based on the growth rate of the thermal oxide film under heat treatment at a temperature less than 1500 degrees C. confirmed to not decrease thermal oxide film thickness. From the results depicted in FIG. 7, it is found that measurement points (5 points encompassed by dotted line frame 42) of the growth rate of the thermal oxide film under heat treatment at 1500 degrees C. or higher are positioned above approximation line 41 and therefore, thermal oxide film thickness is not reduced, i.e., the thermal oxide film does not vaporize. Although not depicted, it was confirmed that even when the partial pressure of oxygen gas in the gas atmosphere used in the activation annealing is 0.01 atm or higher and less than 1 atm, effects about the same as the results depicted in FIGS. 6 and 7 are obtained. Thus, in the present invention, by performing the activation annealing in the gas atmosphere 31 that includes oxygen, the thickness t3' of the thermal oxide film 23 used as a cap layer is not reduced and may adjusted or maintained based on the heat treatment temperature.

The present invention is not limited to the embodiment above and various modifications within a scope not deviating from the spirit of the invention are possible. For example, in the embodiment above, although a MOSFET has been described as an example, the invention is applicable to other MOS type silicon carbide semiconductor devices such as an insulated gate bipolar transistor (IGBT) and the like. The invention is further applicable to all silicon carbide semiconductor devices subject to activation annealing and even when the thermal oxide film used as a cap layer is not left as a constituent element of the silicon carbide semiconductor device, an effect of suppressing the occurrence of surface roughness on the silicon carbide base is obtained. Although in the embodiment, a first conductivity type is assumed to be an n-type and a second conductivity type is assumed to be a p-type, the present invention is similarly implemented when the first conductivity type is a p-type and the second conductivity type is an n-type.

However, when a carbon cap is used as in Japanese Patent Laid-Open Publication No. 2012-227473, the carbon cap is formed by a method of carbonizing by a high-temperature, organic matter such as a resist coated on the surface of the silicon carbide substrate, or is deposited on the surface of the silicon carbide substrate by a chemical vapor deposition (CVD) method or sputtering method. When the carbon cap is formed by carbonizing organic matter, an ashing process to remove the carbon cap is necessary and there is a risk that electrical characteristics may degrade consequent to organic matter residue. When the carbon cap is deposited by a CVD method or sputtering method, a problem arises in that step coverage (surface coverage) of uneven portions of the silicon carbide substrate surface, such as trenches, is poor, for example.

In Japanese Patent Laid-Open Publication Nos. 2012-038771, 2009-146997, 2009-272328, and 2015-135892, no carbon cap is used and therefore, the above problem may be avoided. However, in Japanese Patent Laid-Open Publication No. 2012-038771, the crystal face of the main surface of the silicon carbide substrate is limited and therefore, device characteristics are rate-limited by the characteristics of the crystal face and the degree of freedom decreases in terms of design. In Japanese Patent Laid-Open Publication Nos. 2009-146997 and 2009-272328, similar to a case where a carbon cap is formed, there is a risk of electrical characteristics degrading consequent to residue of the silicon carbide layer used as a cap layer. In Japanese Patent Laid-Open Publication No. 2015-135892, the activation annealing is performed in an inert gas atmosphere and it has been disclosed that oxide films (which the cap layer is) easily vaporize at temperatures higher than 1900 degrees C. Therefore, an oxide film that is to be the cap layer has to be deposited thicker with advanced consideration of the amount that will be vaporized by the activation annealing. Further, a problem arises in that activation annealing cannot be performed at a high temperature at which the entire oxide film that is the cap layer is vaporized and disappears.

According to the described invention, even with activation annealing at a temperature of 1500 degrees C. or higher, the oxide film formed by a coating process to be a cap layer does not vaporize. Therefore, the front surface of the silicon carbide base may be assuredly protected by the oxide film during the activation annealing. For example, formation of the cap layer is simple without the need of a sputtering apparatus for conventionally forming the carbon cap.

The method of manufacturing a silicon carbide semiconductor device according to the embodiment enables the occurrence of surface roughness on the silicon carbide substrate caused by high-temperature heat treatment to be suppressed, enables processing to be simplified, and achieves a high degree of freedom in terms of design.

As described, the method of manufacturing a silicon carbide semiconductor device according to the present invention is useful for silicon carbide semiconductor devices subject to activation annealing and is particularly suitable for silicon carbide semiconductor devices having an insulating film such as a gate insulating film on the surface of a silicon carbide base.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising the steps of:
    introducing an impurity into a surface portion of a front surface of a semiconductor substrate that contains silicon carbide, thereby forming an impurity region in the surface portion;
    covering the front surface of the semiconductor substrate by an oxide film having a thickness of 1 nm or more, after the forming step; and
    activating the impurity in the impurity region by performing a heat treatment, with the oxide film covering the front surface of the semiconductor substrate, at a temperature of 1500 degrees C. or higher in a gas atmosphere that includes oxygen.

2. The method of manufacturing a silicon carbide semiconductor device according to claim 1, wherein the covering the front surface of the semiconductor substrate by the oxide film includes thermally oxidizing the front surface of the semiconductor substrate, thereby forming a thermal oxide film as the oxide film.

3. The method of manufacturing a silicon carbide semiconductor device according to claim 1, wherein the gas atmosphere has a partial pressure of oxygen gas in the range 0.01 atm to 1 atm.

4. The method of manufacturing a silicon carbide semiconductor device according to claim 1, further comprising
    forming an insulated gate structure having a gate insulating film on the front surface of the semiconductor substrate after the activating the impurity, wherein
    the forming the insulated gate structure includes leaving a portion of the oxide film as a gate insulating film of the insulated gate structure.

5. The method of manufacturing a silicon carbide semiconductor device according to claim 1, wherein the covering the front surface of the semiconductor substrate includes covering the front surface of the semiconductor substrate by the oxide film such that the thickness of the oxide film is in the range 1 nm to 30 nm.

* * * * *